(12) United States Patent
Schoenfeld et al.

(10) Patent No.: US 8,735,718 B2
(45) Date of Patent: May 27, 2014

(54) ELECTRODE STRUCTURE, METHOD AND APPLICATIONS

(75) Inventors: Winston V. Schoenfeld, Oviedo, FL (US); Hani Khallaf, El-Minia (EG)

(73) Assignee: University of Central Florida, Orlando, FL (US)

( * ) Notice: Subject to any disclaimer, the term of this patent is extended or adjusted under 35 U.S.C. 154(b) by 150 days.

(21) Appl. No.: 13/090,441

(22) Filed: Apr. 20, 2011

(65) Prior Publication Data

US 2012/0060910 A1 Mar. 15, 2012

Related U.S. Application Data

(60) Provisional application No. 61/382,187, filed on Sep. 13, 2010.

(51) Int. Cl.
  *H01L 31/00* (2006.01)

(52) U.S. Cl.
  USPC .......................................................... 136/256

(58) Field of Classification Search
  CPC .............. H01L 51/442; H01L 51/0036; H01L 51/4253
  USPC ................. 136/243–265; 204/192.29, 192.15
  See application file for complete search history.

(56) References Cited

U.S. PATENT DOCUMENTS

| | | | |
|---|---|---|---|
| 4,112,137 A * | 9/1978 | Zega | 427/529 |
| 6,580,027 B2 | 6/2003 | Forrest | |
| 7,604,843 B1 | 10/2009 | Robinson | |
| 2005/0121068 A1 | 6/2005 | Sager | |
| 2005/0217722 A1 | 10/2005 | Komatsu | |
| 2007/0152189 A1 | 7/2007 | Li | |
| 2008/0211066 A1 | 9/2008 | Akedo | |
| 2008/0280030 A1 | 11/2008 | Van Duren | |
| 2009/0044855 A1 | 2/2009 | Irwin | |

(Continued)

OTHER PUBLICATIONS

Hsu et al.; Preparation and Characterization of Ni-indium Tin Oxide Cosputtered Thin Films for Organic Light-emitting Diode Application; Science Direct, Thin Solid Films 474 (2005) 19-24; 2004 Elsevier B.V.*

(Continued)

*Primary Examiner* — Jeffrey T Barton
*Assistant Examiner* — Niki Bakhtiari
(74) *Attorney, Agent, or Firm* — William Greener; Alek P. Szecsy; Bond, Schoeneck & King, PLLC

(57) ABSTRACT

An organic photovoltaic cell structure and a method for fabricating the organic photovoltaic cell structure are each predicated upon an organic photovoltaic material layer located and formed interposed between an anode and a cathode. The organic photovoltaic cell structure and the method for fabricating the organic photovoltaic cell structure also include for the anode a nickel and indium doped tin oxide material layer (Ni-ITO) that has a nickel doping sufficient to provide a work function of the nickel and indium doped tin oxide material layer (Ni-ITO) anode preferably no more positive than about −5.0 eV. Such a composition of the nickel and indium doped tin oxide material layer (Ni-ITO) anode provides for a superior bandgap matching to a B3HT p-type donor component within a B3HT:BPCM BHJ organic photovoltaic material layer while also providing a greater bandgap separation of an aluminum material layer (Al) cathode to provide for enhanced electric field and charge carrier transport and collection capabilities of an organic photovoltaic cell device that derives from the organic photovoltaic cell structure.

20 Claims, 4 Drawing Sheets

(56) References Cited

U.S. PATENT DOCUMENTS

| | | |
|---|---|---|
| 2010/0065112 A1 | 3/2010 | Thompson |
| 2010/0084011 A1 | 4/2010 | Forrest |
| 2010/0193034 A1 | 8/2010 | Lee |

OTHER PUBLICATIONS

Irwin et al.; p-Type Semiconducting Nickel Oxide as an Efficiency-enhancing Anode Interracial Layer in Polymer Bulk-heterojunction Solar Cells; PNAS, Feb. 26, 2008, vol. 105, No. 8, 2783-2787; 2008 National Academy of Sciences of the USA.*

Yip et al; Self-assembled monolayer modified ZnO/metal bilayer cathodes for polymer/fullerene bulk-heterojunction solar cells; Applied Physics Letters, vol. 19, May 16, 2008.*

Dharmadasa, I.M.; Third Generation Multi-Layer Tandem Solar Cells for Achieving High Conversion Efficiencies; Solar Energy Materials & Solar Cells, 85, 2005, 293-300; 2004 Elsevier B.V.

Hadipour et al.; Solution-Processed Organic Tandem Solar Cell; Advance Functional Materials; 2006, 16, 1897-1903; 2006, Wiley-VCH Verlag GmbH & Co. KGaA, Weinheim.

Han et al.; Improving Performance of Organic Solar Cells Using Amorphous Tungsten Oxides as an Interfacial Buffer Layer on Transparent Anodes; Organic Electronics, 10 (2009), 791-797; 2009 Elsevier B.V.

Irwin et al.; p-Type Semiconducting Nickel Oxide as an Efficiency-enhancing Anode Interfacial Layer in Polymer Bulk-heterojunction Solar Cells; PNAS, Feb. 26, 2008, vol. 105, No. 8, 2783-2787; 2008 National Academy of Sciences of the USA.

Kawano et al.; Degradation of Organic Solar Cells Due to Air Exposure; Science Direct, Solar energy Materials & Solar Cells 90 (2006) 3520-3530; 2006 Elsevier B.V.

Kim et al.; Efficient Tandem Polymer Solar Cells Fabricated by All-Solution Processing; Science, 317, 222 (2007); http://www.sciencemag.org.

Kim et al.; Effects of Thickness and Thermal Annealing of the PEDOT:PSS Layer on the Performance of Polymer Solar Cells; Organic Electronics 10 (2009) 205-209; 2008 Elsevier B.V.

Kim et al.; SnPc:C60 Bulk Heterojunction Organic Photovoltaic Cells with MoO3 Interlayer; Solar Energy Materials & Solar Cells 93 (2009), 1452-1456; 2009 Elsevier B.V.

Liang et al.; For the Bright Future—Bulk Heterojunction Polymer Solar Cells with Power Conversion Efficiency of 7.4%; Advanced Energy Materials, 2010, 22, E135-E138; 2010 Wiley-VCH Verlag GmbH & Co. KGaA, Weinheim.

Mihailetchi et al.; Cathode Dependence of the Open-circuit Voltage of Polymer:Fullerene Bulk Heterojunction Solar Cells; Journal of Applied Physics, vol. 94, No. 10, Nov. 15, 2003, American Institute of Physics.

Nakasa et al.; Fabrication of Nickel Oxide and Ni-doped Indium Tin Oxide Thin Films Using Pyrosol Process; Thin Solid Films 498 (2006) 240-243, 2005 Elsevier B.V.

Saricftci, Niyazi Serdar; Plastic Photovoltaic Devices; Materials Today; Sep. 2004, Elsevier; www.lios.at.

Shrotriya, et al.; Transition Metal Oxides as the Buffer Layer for Polymer Photovoltaic Cells; Applied Physics Letters 88, 073508 (2006), American Institute of Physics.

Sista et al.; High-Efficiency Polymer Tandem Solar Cells with Three-Terminal Structure; Advanced Energy Materials, 2010, 22, E77-E80, 2010 Wiley-VCH Verlag GmbH & Co. KGaA, Weinheim.

Wang et al.; Ultraviolet Luminescent, High-Effective-Work-Function LaTiO3-Doped Indium Oxide and Its Effects in Organic Optoelectronics; Advanced Materials, 2010, 22, 2211-2215; 2010 Wiley-VCH Verlag GmbH & Co. KGaA, Weinheim.

Xue et al.; Asymmetric Tandem Organic Photovoltaic Cells with Hybrid Planar-Mixed Molecular Heterojunctions; Applied Physics Letters, vol. 85, No. 23, Dec. 6, 2004, 2004, American Institute of Physics.

\* cited by examiner

ELECTRODE STRUCTURE, METHOD AND APPLICATIONS

CROSS-REFERENCE TO RELATED APPLICATION

This application is related to, and derives priority from, application Ser. No. 61/382,187, filed Sep. 13, 2010, and titled "Electrode Structure, Method and Applications," the subject matter of which is incorporated herein fully by reference.

BACKGROUND

1. Field of the Invention

Embodiments of the invention relate generally to organic photovoltaic (OPV) cells. More particularly, embodiments of the invention relate to organic photovoltaic cell structures, devices and methods.

2. Description of the Related Art

Due to their low cost, light weight and mechanical flexibility, organic photovoltaic cells have the potential to offer a promising alternative to silicon based photovoltaic cells. Organic photovoltaic cells typically include an organic photovoltaic material interposed between an optically transparent electrode (i.e., optically transparent to a wavelength of light that is desired to be converted into electricity, where the optically transparent electrode often serves as an anode) and an additional electrode (i.e., one which is typically not optically transparent and which typically also serves as a cathode).

Although several alternative materials have been proposed as an organic photovoltaic material within an organic photovoltaic cell, a potentially promising organic photovoltaic material comprises a bulk heterojunction (BHJ) composition of poly(3-hexylthiophene) (P3HT) and [6,6]-phenyl C61 butyric acid methyl ester (PCBM).

While such a P3HT:PCBM BHJ composition provides an operative organic photovoltaic cell under many circumstances, improvements in photovoltaic performance properties of such P3HT:PCBM BHJ based organic photovoltaic cells are desirable insofar as organic photovoltaic cells in general are comparatively inefficient with respect to silicon based photovoltaic cells.

Thus, desirable within organic photovoltaic cell design and fabrication are structures, devices, methods and materials that may be used to fabricate organic photovoltaic cells with enhanced photovoltaic performance properties.

SUMMARY

Embodiments of the invention include an organic photovoltaic cell structure and a method for fabricating the organic photovoltaic cell structure. The organic photovoltaic cell structure and the method for fabricating the organic photovoltaic cell structure in accordance with the embodiments use a nickel and indium doped tin oxide material layer as an anode. By using such a nickel and indium doped tin oxide material layer as an anode, a work function of the anode may be increased (i.e., made more negative) within the context of at least a P3HT:PCBM BHJ organic photovoltaic cell, thus providing for enhanced hole charge carrier extraction, transport and collection within an organic photovoltaic cell device that derives from the organic photovoltaic cell structure, which in turn provides a greater photovoltaic performance efficiency for the organic photovoltaic cell device.

An exemplary non-limiting organic photovoltaic cell structure in accordance with the embodiments includes a nickel and indium doped tin oxide material layer anode located over a transparent substrate. According to an aspect, the organic photovoltaic cell structure also includes a bulk heterojunction organic photovoltaic material layer located over the nickel and indium doped tin oxide material layer anode. According to another aspect, the organic photovoltaic cell structure also includes a conductor material layer cathode located over the bulk heterojunction organic photovoltaic material layer.

Another exemplary non-limiting organic photovoltaic cell structure in accordance with the embodiments includes a nickel and indium doped tin oxide material layer anode located over a transparent substrate. According to an aspect, the organic photovoltaic cell structure also includes a P3HT:PCBM BHJ photovoltaic material layer located over the nickel and indium doped tin oxide material layer anode. According to another aspect, the organic photovoltaic cell structure also includes a cathode conductor material layer located over the P3HT:PCBM BHJ photovoltaic material layer.

An exemplary non-limiting method for fabricating an organic photovoltaic cell structure in accordance with the embodiments includes forming a nickel and indium doped tin oxide material layer anode over a transparent substrate. According to an aspect, the method also includes forming an organic photovoltaic material layer over the nickel and indium doped tin oxide material layer anode. According to another aspect, the method also includes forming a cathode conductor material layer over the organic photovoltaic material layer.

Another exemplary non-limiting method for fabricating an organic photovoltaic cell structure in accordance with the embodiments includes forming a nickel and indium doped tin oxide material layer anode over a transparent substrate. According to an aspect, the method also includes forming a P3HT:PCBM BHJ photovoltaic material layer over the nickel and indium doped tin oxide material layer anode. According to another aspect, the method also includes forming a cathode conductor material layer over the P3HT:PCBM BHJ photovoltaic material layer.

BRIEF DESCRIPTION OF THE DRAWINGS

The objects, features and advantages of the embodiments are understood within the context of the Detailed Description of the Embodiments, as set forth below. The Detailed Description of the Embodiments is understood within the context of the accompanying drawings, that form a material part of this disclosure, wherein.

DETAILED DESCRIPTION OF THE EMBODIMENTS

Figure 1:
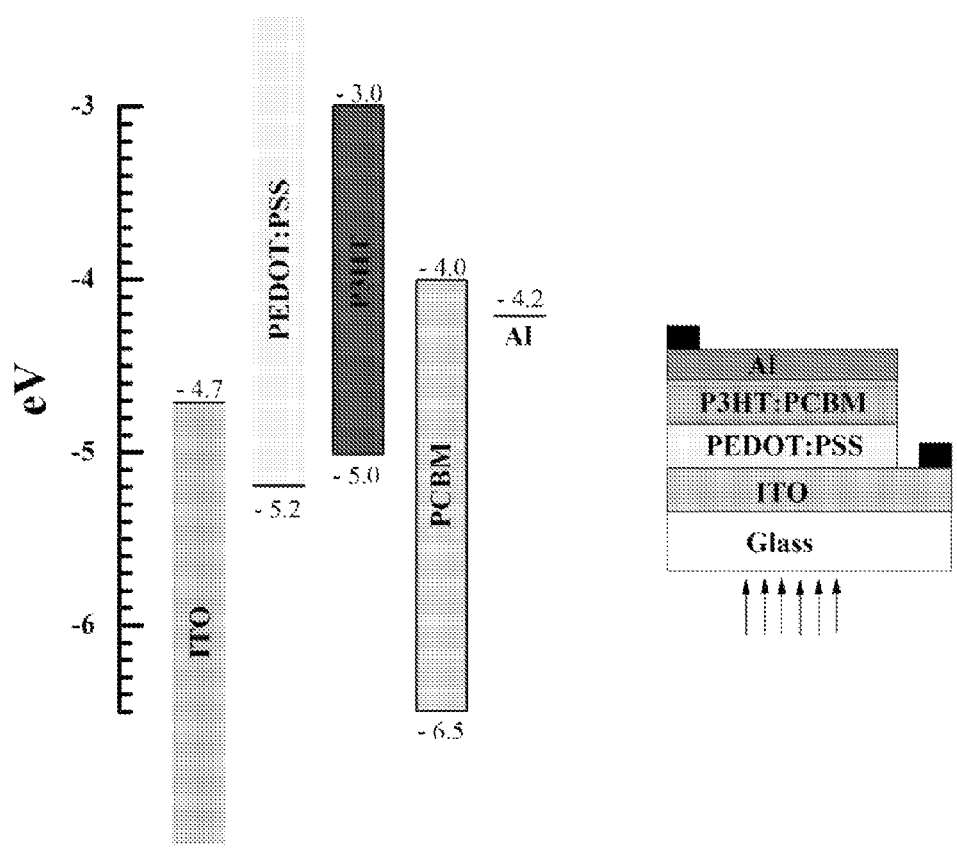
FIG. 1 shows a bandgap energy diagram and a corresponding organic photovoltaic cell structure used in describing the embodiments.

The embodiments, which include an organic photovoltaic cell structure and a method for fabricating the organic photovoltaic cell structure, are understood within the context of the description set forth below. The description set forth below is understood within the context of the drawings described above. Since the drawings are intended for illustrative purposes, the drawings are not necessarily drawn to scale.

For clarity in presentation of the description of the embodiments that follows, the description of the embodiments that follows will first describe: (1) a plurality of organic photovoltaic cell structures in accordance with the embodiments; and (2) related anticipated organic photovoltaic cell device photovoltaic performance properties in accordance with the embodiments. The description of the embodiments that follows will next describe method aspects for fabricating the organic photovoltaic cell structures in accordance with the embodiments.

Within the description of the embodiments that follows, an organic photovoltaic cell "structure" means a physical structure comprising a plurality of differing material layers, where upon illumination with incoming optical radiation the organic photovoltaic cell "structure" is capable of producing an electrical current and voltage output at an anode and cathode designated within the physical structure. In contrast thereto, within the description of the embodiments that follows, an organic photovoltaic cell "device" means the organic photovoltaic cell "structure" that is illuminated with the incoming optical radiation and operative within an electrical circuit for purposes of transforming the incoming optical radiation into electricity.

Within the description of the embodiments that follows, a "nickel and indium doped tin oxide material layer" means a base tin oxide material layer which is doped, or alternatively alloyed, with both nickel and indium, to provide a nominally transparent conductive oxide (TCO) material that is used as an electrode (i.e., typically but not necessarily anode) within an organic photovoltaic cell structure or device. The doping, or alternative alloying of the "nickel and indium doped tin oxide material layer" in accordance with the embodiments may be effected using any of several methods as described below.

Within the description of the embodiments that follows, and also in particular within the claims, with respect to material layers that comprise an embodied or claimed (i.e., inventive) organic photovoltaic cell "structure," "over" means that a particular upper lying second material layer is located and formed above a particular lower lying first material layer with a possibility (but not necessarily a requirement) of intervening layers interposed between the particular lower lying first material layer and the particular upper lying second material layer. In contrast thereto, and within the same context with respect to a lower lying first material layer and an upper lying second material layer, "upon" means that the particular upper lying second material layer is located and formed contacting the particular lower lying first material layer.

Organic Photovoltaic Cell Structure and Device Performance Properties

In regard to general organic photovoltaic cell device performance properties, the embodiments contemplate that one of the major anticipated limitations of a P3HT:PCBM BHJ organic photovoltaic cell device is an inefficient charge carrier extraction, particularly to the anode electrode (i.e., hole extraction, transport and collection) of the organic photovoltaic cell device. Although, an indium-doped tin oxide material layer (ITO) is commonly used as an organic photovoltaic cell device structure (i.e., within a P3HT:PCBM BHJ organic photovoltaic cell structure as well as other organic photovoltaic cell structures), the work function of a common indium-doped tin oxide material is, as is illustrated in FIG. 1, typically from about −4.4 eV to about −4.7 eV (see, e.g., Wang et al., Adv. Mater., 22, 1 (2010); and Kim et al., Organic Elect., 10, 205 (2009)), which typically provides a Schottky barrier from about 0.3 eV to about 0.6 eV for hole extraction, transport and collection from a p-type donor component P3HT within a P3HT:PCBM BHJ organic photovoltaic material. For such a hole extraction, transfer and collection barrier, the highest occupied molecular orbital (HOMO) level of the p-type donor component P3HT is located at about −5.0 eV (i.e., below vacuum), as is illustrated in FIG. 1. Such a Schottky barrier from about 0.3 eV to about 0.6 eV will have a detrimental effect upon a short circuit current ($J_{SC}$) of such a P3HT:PCBM BHJ organic photovoltaic cell device.

Another anticipated drawback of the use of an indium-doped tin oxide material layer (ITO) as an anode within an organic photovoltaic cell structure or device in general is a high surface roughness of the indium-doped tin oxide material (i.e., about 5 nm surface roughness; see, e.g., Hsu et al., Thin Solid Films, 474, 19 (2005)). Such an enhanced surface roughness may provide local shunts and/or short circuits which may have a significant negative impact on the performance of an organic photovoltaic cell device.

An approach to address the surface roughness considerations of an indium-doped tin oxide material layer (ITO) as an anode within an organic photovoltaic cell device is to deposit (i.e., typically spin coat) a comparatively thin layer of poly (3,4-ethylenedioxythiophene):poly(styrenesulfonate) (PEDOT:PSS) on a top surface of the indium-doped tin oxide material layer (ITO) anode. The highest occupied molecular orbital (HOMO) level of PEDOT:PSS, which is about −5.2 eV, closely matches that of P3HT at about −5.0 eV, as shown in FIG. 1.

However the PEDOT:PSS composition is hydrophilic, and the hydrophilic composition absorbs moisture which results in the deterioration of the hydrophobic active layer of the organic photovoltaic cell structure that comprises the P3HT:PCBM BHJ organic photovoltaic material. In that regard, it has been reported that when PEDOT:PSS is used to address surface roughness considerations within an organic photovoltaic cell device, an organic photovoltaic cell device half-life time (i.e., the time it will take the organic photovoltaic cell device efficiency to drop to 50% of an initial value) is about 3 hours (see, e.g., Kawano et al., Sol. Energy Mat. Sol. Cells, 90, 3520 (2006)).

In addition, the PEDOT:PSS material composition is typically highly acidic (i.e., having a pH of about 1.0), which is corrosive to the indium-doped tin oxide material layer (ITO) anode. Moreover, spin coating of the PEDOT:PSS material layer typically results in inconsistent film morphologies and electrical inhomogeneity that results in local shunts (see, e.g., Irwin et al., PNAS, 105, 2783 (2008)). In addition, any hole charge carriers that are extracted, transported and collected from such a PEDOT:PSS material layer will nonetheless still encounter a Schottky barrier at the PEDOT:PSS/indium-doped tin oxide material layer (ITO) anode interface as is illustrated in FIG. 1.

Surface roughness passivating alternatives to a PEDOT:PSS material layer, such as $MoO_3$ (Kim et al., Sol. Energy Mat. Sol. Cells, 93, 1452 (2009)), $V_2O_5$ (Shrotriya et al., Appl. Phys. Lett., 88, 073508 (2006)), $WO_3$ (Han et al., Organic Elect., 10, 791 (2009)), and NiO (Irwin et al., PNAS, 105, 2783 (2008)), have been investigated.

Figure 2:
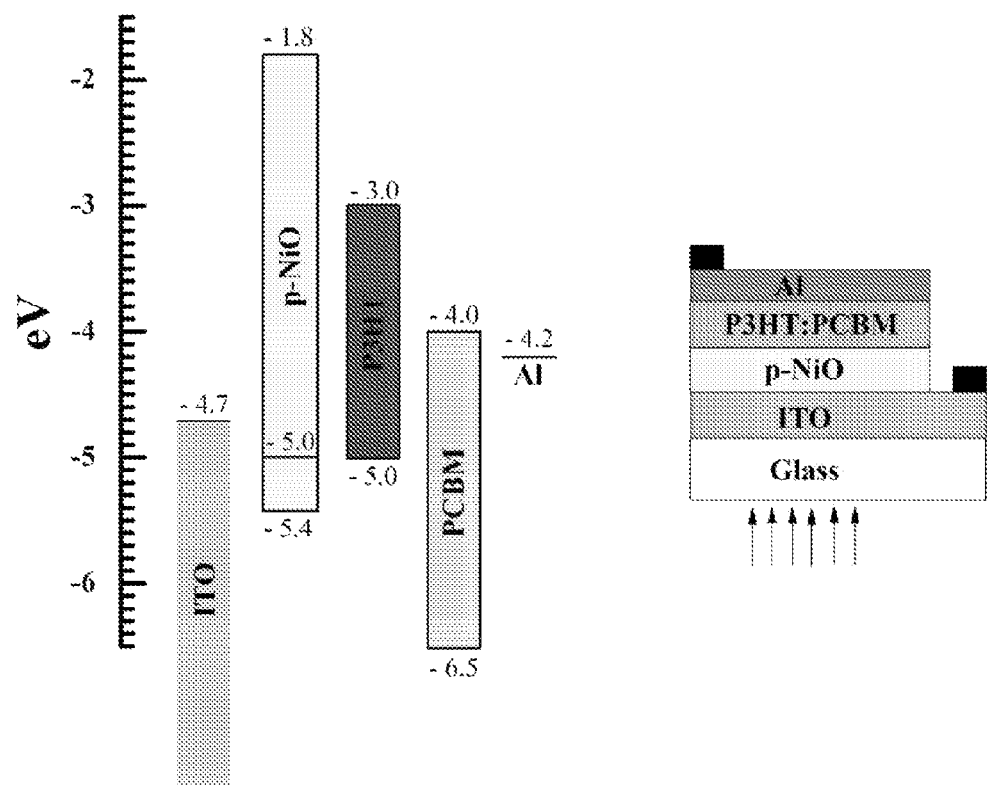
FIG. 2 shows another bandgap energy diagram and another corresponding organic photovoltaic cell structure used in describing the embodiments.

For example, FIG. 2 shows a P3HT:PCBM BHJ organic photovoltaic cell structure and related energy bandgap diagram utilizing a nickel oxide material layer (p-NiO) interposed between an indium-doped tin oxide material layer (ITO) anode and a P3HT:PCBM BHJ active organic photovoltaic material layer.

As shown in FIG. 2, the Fermi level of the nickel oxide material layer (p-NiO) of about −5.0 eV matches well with the HOMO of P3HT, which is also about −5.0 eV. However, a 0.3 eV barrier still exists at the nickel oxide material layer (p-NiO)/indium-doped tin oxide material layer (ITO) interface. In addition, the open circuit voltage $V_{OC}$ for the organic photovoltaic cell device that is illustrated in FIG. 2 is limited by the difference between the work functions of the indium-doped tin oxide material layer (ITO) anode and an aluminum material layer (Al) cathode, which is about 0.5 V.

The embodiments are intended to address the foregoing anticipated photovoltaic performance property limitations of the organic photovoltaic cell structures of FIG. 1 and FIG. 2 in-part and primarily by replacing the indium-doped tin oxide material layer (ITO) anode with a nickel and indium doped tin oxide material layer (Ni-ITO) anode. Such an organic photovoltaic cell structure is illustrated in greater detail within FIG. 3. To ensure an ohmic contact for hole extraction, transport and collection at the anode of an organic photovoltaic cell device predicated upon a P3HT:PCBM BHJ organic photovoltaic material, a work function of the anode in accordance with the embodiments is desirably equal to or more negative than about −5.0 eV.

Additional nickel doping of an indium-doped tin oxide material layer (ITO) anode may provide the more negative work function of such a nickel and indium-doped tin oxide material layer (Ni-ITO) anode while maintaining a high optical transparency and conductivity of the nickel and indium doped tin oxide material layer (Ni-ITO) anode. The foregoing properties are desirable for an operative transparent conducting oxide material layer (TCO) anode within an organic photovoltaic cell, such as an indium-doped tin oxide material layer (ITO) anode (see, e.g., Hsu et al., Thin Solid Films, 474, 19 (2005); and Nakasa et al., Thin Solid Films, 498, 240 (2006)).

In a non-limiting aspect, a nickel and indium doped tin oxide material layer (Ni-ITO) suitable for an organic photovoltaic cell structure or device anode may be deposited using a sputtering method. Moreover, a work function measurement, as well as anticipated electrical property and optical property measurements of deposited nickel and indium doped tin oxide material layer (Ni-ITO) anodes in accordance with the embodiments are anticipated to be readily measurable using Kelvin probe measurements, Hall effect measurements, and transmittance/reflectance measurements, respectively.

Thus, in accordance with the embodiments, it is anticipated to deposit a nickel and indium doped tin oxide material layer (Ni-ITO) anode within a P3HT:PCBM BHJ (or other) organic photovoltaic cell structure with a work function optimally of about −5.2 eV (i.e., from less than about (or no more positive than about)-5.0 eV to about −5.4 eV, and more particularly, from about −5.1 eV to about −5.3 eV). Such a work function will provide an ohmic contact for the hole extraction, transport and collection at the nickel and indium doped tin oxide material layer (Ni-ITO) anode, and also provide an additional nominal 0.5 V to an open circuit potential ($V_{OC}$) of the P3HT:PCBM BHJ organic photovoltaic cell device. Similarly, this additional nominal 0.5 V should provide a higher electric field within the P3HT:PCBM BHJ organic photovoltaic cell device that will enhance the charge separation and charge collection within the P3HT:PCBM BHJ organic photovoltaic cell device.

In general, and under intense photo-illumination, such as but not limited to AM 1.5 solar simulated photo-irradiation-illumination, the charges generated in an active layer of an organic photovoltaic cell device as embodied herein may exceed 10E18 cm$^{-3}$ (see, e.g. Sariciftci et al., Materials Today, 7 (9), 36 (2004)). This level of charge generation may screen the electric field induced by the anode and cathode electrodes within an organic photovoltaic cell device in accordance with the embodiments. As a result, a more complex organic photovoltaic cell structure may be desirable to enhance the photovoltaic performance properties and efficiency of an organic photovoltaic cell device in accordance with the embodiments. Such an organic photovoltaic cell structure and related energy band diagram are illustrated in FIG. 4.

Figure 3:
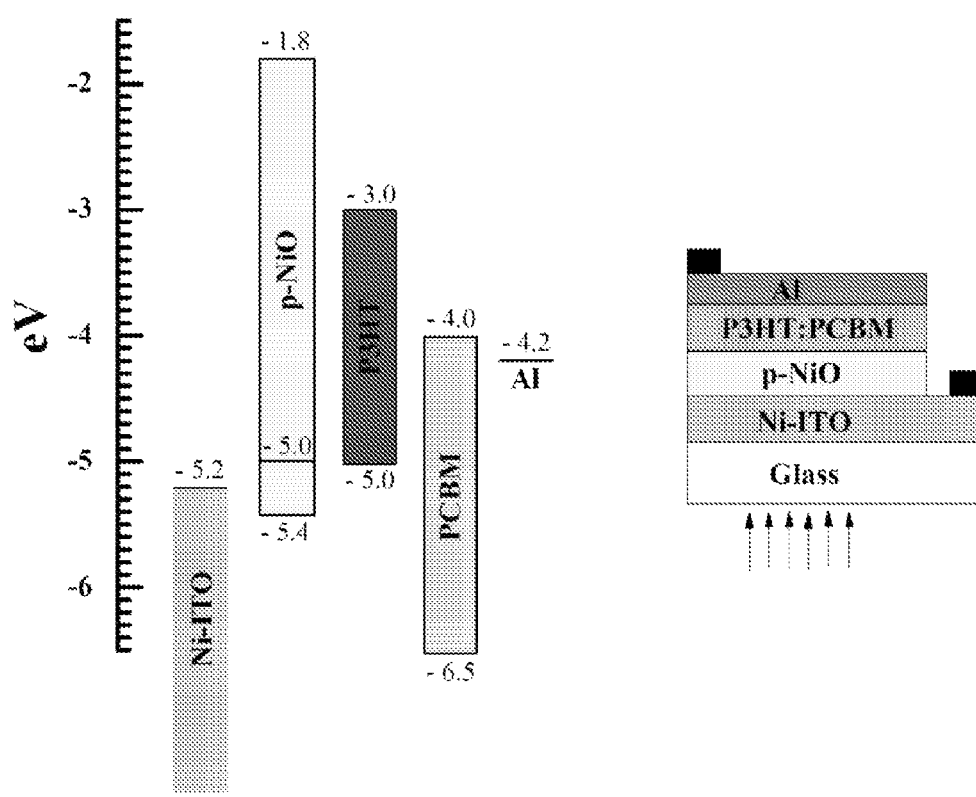
FIG. 3 shows a bandgap energy diagram and a corresponding organic photovoltaic cell structure in accordance with the embodiments.
Figure 4:
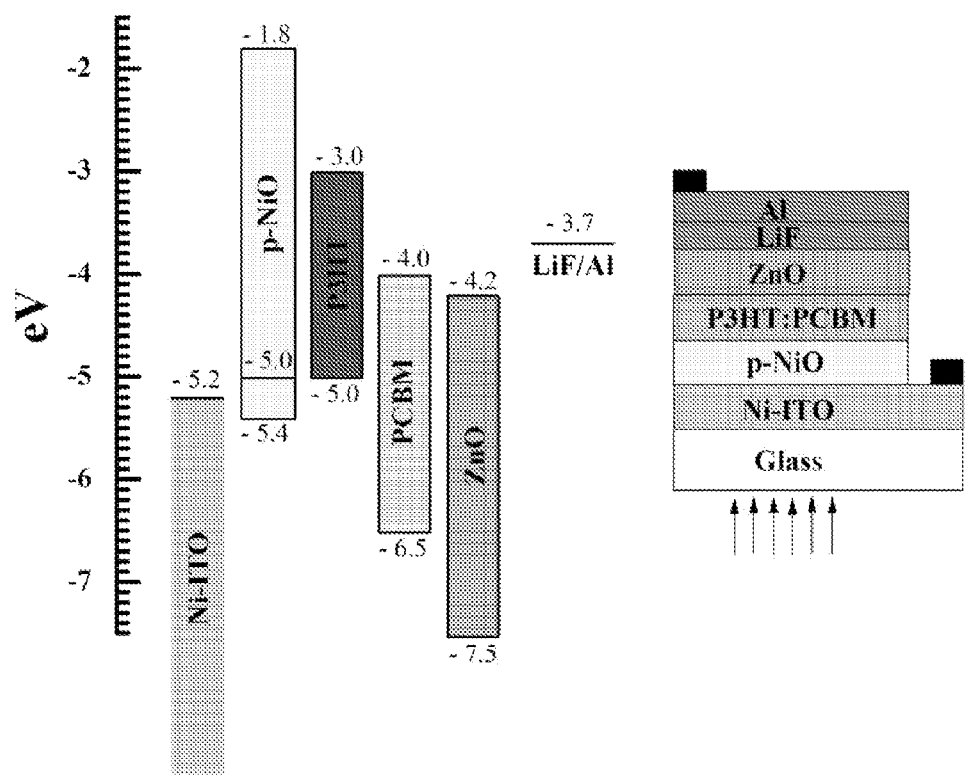
FIG. 4 shows another bandgap energy diagram and another corresponding organic photovoltaic cell structure in accordance with the embodiments.

The organic photovoltaic cell structure of FIG. 4 includes the nickel and indium-doped tin oxide material layer (Ni-ITO) of FIG. 3 as an anode layer, with an anticipated nominal work function of −5.2 eV, as may be fabricated using a deposition method such as, but not limited to, a sputtering method. The nickel and indium doped tin oxide material layer (Ni-ITO) anode is located and formed upon a suitable optically transparent substrate (i.e., designated as glass) that is otherwise generally conventional. Located and formed upon the nickel and indium doped tin oxide material layer (Ni-ITO) anode is a thin layer (i.e., from about 10 to about 15 nanometers) of a nickel oxide material (p-NiO). Located and formed upon the nickel oxide material layer (p-NiO) is a P3HT:PCBM BHJ organic photovoltaic material layer having an otherwise generally conventional thickness. Located and formed upon the P3HT:PCBM BHJ organic photovoltaic material layer is a zinc oxide material layer (ZnO) having a generally conventional thickness. Located and formed upon the zinc oxide material layer (ZnO) is a lithium fluoride material layer (LiF) having a thickness of about 1 nanometer. Located and formed upon the lithium fluoride material layer (LiF) is an aluminum material layer (Al) having a generally conventional thickness that serves as a cathode within the organic photovoltaic cell structure of FIG. 4.

Within the organic photovoltaic cell structure whose schematic cross-sectional diagram is illustrated in FIG. 4, a conduction band minimum (CBM) of the nickel oxide material layer (p-NiO) (i.e., about −1.8 eV) is anticipated to introduce a barrier of about 2.2 eV for the electrons at the lowest unoccupied molecular orbital level of the PCBM material (i.e., about −4.0 eV). Thus, in addition to serving as a hole transport layer, the nickel oxide material layer (p-NiO) is anticipated to also serve as an electron blocking layer, which is anticipated to block any injection of electrons into the nickel and indium doped tin oxide material layer (Ni-ITO) anode electrode of the organic photovoltaic cell device of FIG. 4, and thereby enhance the charge separation in the organic photovoltaic device that results from the organic photovoltaic cell structure.

Moreover, the nickel oxide material layer (p-NiO) is anticipated to reduce the surface roughness of the nickel and indium doped tin oxide material layer (Ni-ITO) anode, which in turn is anticipated to increase the shunt resistance of the organic photovoltaic device. Also, considering that the valence band maximum (VBM) of zinc oxide is about −7.5 eV, the zinc oxide material layer (ZnO) is anticipated to introduce a barrier of 2.5 eV to holes located at the highest occupied molecular orbital (HOMO) level of the P3HT component of the P3HT:PCBM BHJ organic photovoltaic material composition.

In addition, the conduction band minimum (CBM) of the zinc oxide material layer (ZnO) is about −4.2 eV, which is about 0.2 eV below the lowest unoccupied molecular orbital (LUMO) level of the PCBM material. Thus, the zinc oxide material layer (ZnO) is anticipated to act as an electron transport layer and a hole blocking layer concurrently. Thus, by blocking the injection, transport and collection of holes into the cathode, inclusion of the zinc oxide material layer (ZnO) within the organic photovoltaic cell structure of FIG. 4 is anticipated to further enhance the charge separation in an organic photovoltaic cell device that results from the organic photovoltaic cell structure.

Finally, to ensure an ohmic contact between the zinc oxide electron transport material layer (ZnO) and the aluminum material layer (Al) cathode, a thin lithium fluoride material layer (LiF) is located and formed interposed between the zinc oxide material layer (ZnO) and the aluminum material layer (Al) cathode. An effective work function of this lithium fluoride material layer (LiF)/aluminum material layer (Al) cathode laminate is anticipated to be about −3.7 eV (see, e.g., Mihailetchi et al., J. Appl. Phys., 94, 6849 (2003)). This particular ordering of the lithium fluoride material layer (LiF) and the aluminum material layer (Al) cathode laminate is anticipated to introduce another 0.5 V to the open circuit voltage ($V_{OC}$) limit of the organic photovoltaic cell device, which will exceed the theoretical maximum open circuit voltage ($V_{OC}$) that this particular organic photovoltaic cell device could provide (i.e., about 1.0 V).

This particular ordering of the lithium fluoride material layer (LiF) and aluminum material layer (Al) cathode is anticipated also to increase the electric field induced by the difference in work functions of the anode and cathode electrodes (anticipated to be about 1.5 V instead of about 0.5 V).

While not necessarily being limited to the foregoing analysis or line of reasoning, it is further anticipated that this final organic photovoltaic cell structure as illustrated in FIG. 4, and in accordance with the embodiments, should enhance the internal quantum efficiency of the resulting organic photovoltaic cell device significantly and will result in a high short circuit current ($J_{SC}$) and a high photovoltaic efficiency in the resulting organic photovoltaic cell device.

While the foregoing discussion has been directed towards an embodiment describing an organic photovoltaic cell structure or device comprising a P3HT:PCBM BHJ organic photovoltaic material layer composition, this particular embodiment is not intended to limit the invention. Rather, in a more general sense, also contemplated are alternative embodiments of organic photovoltaic cell structures and devices that include other organic photovoltaic material layer compositions where a p-type donor component of a BHJ organic photovoltaic material layer composition has a highest occupied molecular orbital (HOMO) that may be at least as negative as about −5.0 eV.

Anticipated Fabrication Methodology

The organic photovoltaic cell structure in accordance with the embodiments as illustrated in FIG. 3 or FIG. 4 is anticipated to be fabricated using methods and materials that are otherwise generally conventional in the organic photovoltaic cell design and fabrication art, and more generally the electronics and microelectronics design and fabrication art.

For example, the substrate as is illustrated in FIG. 3 and FIG. 4 (i.e., which is designated as a glass substrate) is anticipated to comprise any substrate material that is transparent with respect to incoming radiation (i.e., which will typically comprise incoming solar radiation) that is desired to be photovoltaically transformed into electricity. Such anticipated alternative substrate materials may include, but are not limited to, glass substrate materials of various varieties and dopant compositions, quartz substrate materials and certain plastic substrate materials having an appropriate optical transparency and optical clarity. According to an illustrative aspect, the substrate is anticipated to comprise a glass substrate, such as but not limited to a tempered glass substrate.

As discussed above, the nickel and indium doped tin oxide material layer (Ni-ITO) anode will include a nickel component that provides a work function in a range from at least about (or alternatively more negative than about, or further alternatively no more positive than about)-5.0 eV to about −5.4 eV, more particularly from about −5.1 eV to about −5.3 eV and most particularly about −5.2 eV, so that the embodiments provide an enhanced hole extraction, transfer and collection ability of the organic photovoltaic cell device of FIG. 3 or FIG. 4 with respect to the nickel and indium doped tin oxide material layer (Ni-ITO) anode.

Also in accordance with the disclosure above, the nickel and indium doped tin oxide material layer (Ni-ITO) anode is anticipated to be formed using any of several methods that are also otherwise generally conventional in the electronics and microelectronics design and fabrication art, if not necessarily the organic photovoltaic cell design and fabrication art. Included but not limiting among these anticipated methods are chemical vapor deposition (CVD) methods and physical vapor deposition (PVD) methods. Further included within the context of physical vapor deposition (PVD) methods are thermal evaporation methods and sputtering methods, which may include, but are also not limited to: (1) purely physical sputtering methods (i.e., which are typically intended to physically remove material from a target and deposit the material removed from the target compositionally unchanged upon a substrate); and (2) reactive sputtering methods (i.e., which are typically differentiated from purely physical sputtering methods by inclusion of a chemical reaction that provides a chemical difference between a sputter target material that is sputtered and a deposited material layer deposited from the sputter target material). Illustratively, the embodiments anticipate use a physical sputtering method that uses a prefabricated nickel and indium doped tin oxide material target having a composition desirable within the nickel and indium doped tin oxide material layer (Ni-ITO) anode as illustrated in FIG. 3 and FIG. 4.

As is discussed above, the nickel and indium doped tin oxide material layer (Ni-ITO) anode comprises a nickel content that provides a work function with ranges that center at −5.2 eV, so that the nickel and indium doped tin oxide material layer (Ni-ITO) anode provides the enhanced and optimized photovoltaic performance properties within an organic photovoltaic cell device in accordance with the embodiments. As noted above, the nickel and indium doped tin oxide material layer (Ni-ITO) anode is anticipated to be formed using a physical sputtering method that uses argon or other inert gas ions as a sputtering medium to provide the nickel and indium doped tin oxide material layer (Ni-ITO) anode of appropriate composition.

The P3HT:PCBM BHJ organic photovoltaic material layer, the p-nickel oxide material layer (p-NiO), the zinc oxide material layer, the lithium fluoride material layer and the aluminum material layer are each also anticipated to be formed using methods and materials that are otherwise considered to be generally conventional for forming those material layers.

The p-nickel oxide material layer (p-NiO) (i.e., which does not include an indium dopant) is anticipated to be located and formed upon the nickel and indium doped tin oxide material layer (Ni-ITO) anode using methods that are noted above, and in particular using a chemical vapor deposition (CVD) method or alternatively a physical vapor deposition (PVD) method. The p dopant (i.e., p-type dopant) that is included within the p-nickel oxide material layer (p-NiO) may be anticipated to be included within a sputtering target that is used for forming the p-nickel oxide material layer (p-NiO), if the p-nickel oxide material layer (p-NiO) is formed using a sputtering method. Alternatively, the p dopant is anticipated to be co-deposited within a chemical vapor deposition (CVD) method. Further alternatively, the p dopant is anticipated to be subsequently incorporated into an otherwise undoped nickel oxide material layer located and formed upon the nickel and indium doped tin oxide material layer (Ni-ITO) anode via a method such as but not limited to an ion implantation method or a thermal diffusion method. Typically the p-nickel oxide material layer (p-NiO) is anticipated to include a p dopant such as but not limited to a boron dopant, at a generally conventional concentration. Typically and preferably, the p-nickel oxide material layer (p-NiO) is anticipated to have a generally conventional thickness.

The P3HT:PCBM BHJ organic photovoltaic material layer is anticipated to comprise an otherwise generally conventional composition of the P3HT and PCBM organic photovoltaic material components that are generally included at a generally conventional P3HT:PCBM molar ratio concentration. The particular P3HT and PCBM organic photovoltaic material components are anticipated to be deposited upon the p-nickel oxide material layer (p-NiO) using any coating method that is otherwise generally conventional in the organic photovoltaic cell design and fabrication art, and in particular a coating method such as but not limited to a spin coating method. Illustratively, the P3HT:PCBM BHJ organic photovoltaic material layer is anticipated to be located and formed upon the p-nickel oxide material layer (p-NiO) to a generally conventional thickness using a spin coating method that uses a solvent solution.

The zinc oxide material layer (ZnO) is anticipated to be located and formed upon the P3HT:PCBM BHJ organic photovoltaic material layer using any of several methods that are otherwise generally conventional in the organic photovoltaic cell design and fabrication art, or alternatively the electronics and microelectronics design and fabrication art. Such methods may include, but are not necessarily limited to, chemical vapor deposition (CVD) methods and physical vapor deposition (PVD) methods. More particularly, the zinc oxide material layer (ZnO) is preferably anticipated to be located and formed upon the P3HT:PCBM BHJ organic photovoltaic material layer while using a sputtering method, such as a non-reactive physical sputtering method, to provide the zinc oxide material layer (ZnO) of a generally conventional thickness.

Similarly with underlying layers within the organic photovoltaic cell structure whose schematic diagram is illustrated in FIG. 4, the lithium fluoride material layer (LiF) is also anticipated to be formed using any of several methods, including but not limited to chemical vapor deposition (CVD) methods and physical vapor deposition (PVD) methods.

Finally, the aluminum material layer (Al), which serves as a cathode within the organic photovoltaic cell structure of FIG. 4, is also anticipated to be formed using any of several methods that are otherwise generally conventional in the organic photovoltaic cell design and fabrication art, or alternatively the electronic or microelectronics design and fabrication art. Such an aluminum material layer (Al) is anticipated to be formed using physical vapor deposition methods, such as but not limited to sputtering methods and evaporative methods, although thermal evaporation methods are generally common.

The organic photovoltaic cell structure whose schematic cross-sectional diagram is illustrated in FIG. 3 or FIG. 4 is anticipated to be fabricated using a sequence of deposition methods that is otherwise generally conventional in the organic photovoltaic cell structure design and fabrication art. To that end, advantageously, the organic photovoltaic cell structure of FIG. 3 or FIG. 4 is anticipated to be fabricated using single individually separated fabrication tools, or alternatively a single fabrication tool with multiple deposition sources or deposition chambers, all maintained under vacuum so that sequential layers of the organic photovoltaic cell structure of FIG. 3 or FIG. 4 may be deposited sequentially absent exposure of the organic photovoltaic cell structure to atmosphere that might cause for interfacial modification and contamination of the organic photovoltaic cell structure of FIG. 3 or FIG. 4.

The foregoing embodiments of the invention are illustrative of the invention rather than limiting of the invention. To that end, revisions and modifications may be made to methods, materials, structures and dimensions of an organic photovoltaic cell structure or related method in accordance with the embodiments while still providing an organic photovoltaic cell structure and related method in accordance with the invention, further in accordance with the accompanying claims.

As is understood by a person skilled in the art, within the context of the above disclosure, all references, including publications, patent applications and patents cited herein are hereby incorporated by reference in their entireties to the extent allowed, and to the same extent as if each reference was individually and specifically indicated to be incorporated by reference and was set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is some other element intervening.

The recitation of ranges of values herein is merely intended to serve as an efficient method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise indicated.

No language in the specification should be construed as indicating any non-claimed element as essential to the practice of the invention.

It will be thus further apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions and equivalents falling within the spirit and scope of the invention, as defined in the appended claims. Thus, it is intended that the present invention cover the modifications and variations of this invention provided they come within the scope of the appended claims and their equivalents.

What is claimed is:

1. A photovoltaic cell structure comprising:
a nickel and indium doped tin oxide material layer anode located over a transparent substrate;
a bulk heterojunction organic photovoltaic material layer located over the nickel and indium doped tin oxide material layer anode; and
a conductor material layer cathode located over the bulk heterojunction organic photovoltaic material layer
wherein the photovoltaic cell structure does not include an otherwise undoped indium doped tin oxide material layer.

2. The photovoltaic cell structure of claim 1 wherein:
the nickel and indium doped tin oxide material layer anode has a first work function; and
the bulk heterojunction organic photovoltaic material layer includes a p-type donor component having a highest occupied molecular orbital no more negative than the first work function.

3. The photovoltaic cell structure of claim 2 wherein:
the first work function is no more positive than about −5.0 eV; and
the p-type donor component that has a highest occupied molecular orbital that is no more negative than about −5.0 eV.

4. The photovoltaic cell structure of claim 1 wherein the conductor material layer cathode comprises a lithium fluoride/aluminum conductor material layer laminate that has a second work function that is no more negative than about −3.7 eV.

5. A photovoltaic cell structure comprising:
a nickel and indium doped tin oxide material layer anode located over a transparent substrate;
a P3HT:PCBM BHJ photovoltaic material layer located over the nickel and indium doped tin oxide material layer anode; and
a cathode conductor material layer located over the P3HT:PCBM BHJ photovoltaic material layer
wherein the photovoltaic cell structure does not include an otherwise undoped indium doped tin oxide material layer.

6. The photovoltaic cell structure of claim 5 wherein the nickel and indium doped tin oxide material layer anode has a work function no more positive than about −5.0 eV.

7. The photovoltaic cell structure of claim 5 wherein the nickel and indium doped tin oxide material layer has a work function from about −5.0 eV to about −5.4 eV.

8. The photovoltaic cell structure of claim 5 wherein the nickel and indium doped tin oxide material layer has a work function from about −5.1 eV to about −5.3 eV.

9. The photovoltaic cell structure of claim 5 wherein the cathode conductor material layer comprises an aluminum conductor material.

10. The photovoltaic cell structure of claim 5 further comprising a nickel oxide material layer located interposed between the nickel and indium doped tin oxide material layer anode and the P3HT:PCBM BHJ photovoltaic material layer.

11. The photovoltaic cell structure of claim 10 wherein the nickel oxide material layer comprises a p-type doped nickel oxide material that does not include an indium dopant.

12. The photovoltaic cell structure of claim 5 further comprising:
a zinc oxide material layer located interposed between the P3HT:PCBM BHJ material layer and the cathode conductor material layer; and
a lithium fluoride material layer located interposed between the zinc oxide material layer and the cathode conductor material layer.

13. A method for fabricating a photovoltaic cell structure comprising:
forming a nickel and indium doped tin oxide material layer anode over a transparent substrate;
forming an organic photovoltaic material layer over the nickel and indium doped tin oxide material layer anode; and
forming a cathode conductor material layer over the organic photovoltaic material layer
wherein the photovoltaic cell structure does not include an otherwise undoped indium doped tin oxide material layer.

14. The method of claim 13 wherein the forming the nickel and indium doped tin oxide material layer anode provides the nickel and indium doped tin oxide material layer anode with a work function no more positive than about −5.0 eV.

15. A method for fabricating a photovoltaic cell structure comprising:
forming a nickel and indium doped tin oxide material layer anode over a transparent substrate;
forming a P3HT:PCBM BHJ photovoltaic material layer over the nickel and indium doped tin oxide material layer anode; and
forming a cathode conductor material layer over the P3HT:PCBM BHJ photovoltaic material layer
wherein the photovoltaic cell structure does not include an otherwise undoped indium doped tin oxide material layer.

16. The method of claim 15 wherein the forming the nickel and indium doped tin oxide material layer anode provides the nickel and indium doped tin oxide material layer anode with a work function no more positive than about −5.0 eV.

17. The method of claim 15 wherein the forming the nickel and indium doped tin oxide material layer uses a sputtering method.

18. The method of claim 17 wherein the sputtering method comprises a non-reactive sputtering method.

19. The method of claim 17 wherein the sputtering method comprises a reactive sputtering method.

20. The method of claim 15 further comprising forming a nickel oxide material layer comprising a p-type doped nickel oxide material absent an indium dopant interposed between the nickel and indium doped tin oxide material layer anode and the P3HT:PCBM BHJ photovoltaic material layer.

* * * * *